United States Patent
Pao et al.

(10) Patent No.: US 11,342,019 B2
(45) Date of Patent: May 24, 2022

(54) COMPENSATION WORD LINE DRIVER

(71) Applicant: Taiwan Semiconductor Manufacturing Co., Ltd., Hsin-Chu (TW)

(72) Inventors: Chia-Hao Pao, Hsinchu (TW); Shih-Hao Lin, Hsinchu (TW); Kian-Long Lim, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/937,824

(22) Filed: Jul. 24, 2020

(65) Prior Publication Data

US 2021/0098051 A1    Apr. 1, 2021

Related U.S. Application Data

(60) Provisional application No. 62/907,447, filed on Sep. 27, 2019.

(51) Int. Cl.
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ............................ G11C 11/418; G11C 11/419
USPC ........................................................ 365/156
See application file for complete search history.

(56) References Cited

U.S. PATENT DOCUMENTS

| | | | | |
|---|---|---|---|---|
| 7,218,570 | B2* | 5/2007 | So ........................... | G11C 5/063 365/230.06 |
| 2002/0114191 | A1* | 8/2002 | Iwata .................. | G11C 11/4085 365/185.23 |
| 2006/0215440 | A1* | 9/2006 | Cho .................... | G11C 13/0004 365/148 |
| 2009/0310403 | A1* | 12/2009 | Choi ...................... | G11C 13/00 365/163 |
| 2010/0128516 | A1* | 5/2010 | Cho ..................... | G11C 13/004 365/163 |
| 2010/0153775 | A1* | 6/2010 | Sugawara ............ | G11C 29/846 714/6.13 |

(Continued)

OTHER PUBLICATIONS

Jhon Jhy Liaw, et al., "Fin-Based Strap Cell Structure for Improving Memory Performance", U.S. Appl. No. 15/957,708, filed Apr. 19, 2018, Assignee: Taiwan Semiconductor Manufacturing Co., Ltd., 51 pages specification, 15 pages drawings.

*Primary Examiner* — Sung Il Cho
(74) *Attorney, Agent, or Firm* — Haynes and Boone, LLP (57) ABSTRACT

Memory systems are provided. In an embodiment, a memory device includes a word line driver coupled to a plurality of word lines, a recycle multiplexer coupled to a plurality of bit lines and a plurality of bit line bars, a memory cell array, and a compensation word line driver. The memory cell array includes a first end adjacent the word line driver, a second end away from the word line driver, and a plurality of memory cells. The compensation word line driver is disposed adjacent the second end of the memory cell array and coupled to the plurality of word lines. The recycle multiplexer is configured to selectively couple one or more of the plurality of bit lines or one or more of the plurality of bit line bars to the compensation word line driver.

20 Claims, 7 Drawing Sheets

(56) References Cited

U.S. PATENT DOCUMENTS

| | | | |
|---|---|---|---|
| 2014/0119148 A1* | 5/2014 | Earle | G11C 8/16 365/230.02 |
| 2015/0109870 A1* | 4/2015 | Ishizu | G11C 11/412 365/191 |
| 2020/0027497 A1* | 1/2020 | Shin | G11C 11/4091 |

* cited by examiner

COMPENSATION WORD LINE DRIVER

PRIORITY DATA

This application claims priority to U.S. Provisional Patent Application Ser. No. 62/907,447 filed on Sep. 27, 2019, the entire disclosure of which is hereby incorporated herein by reference.

BACKGROUND

Static random-access memory ("SRAM") generally refers to any memory or storage that can retain stored data only when power is applied. As integrated circuit (IC) technologies progress towards smaller technology nodes, SRAMs may incorporate multi-gate structures, such as fin-like field effect transistors (FinFETs) or gate-all-around (GAA) transistors, into SRAM cells to enhance performance and increase packing density, where each SRAM cell can store a bit of data. SRAM cells are arranged into densely packed SRAM arrays, access to which is controlled by pass-gate transistors (or access transistors) activated by word line signals. As a word line extends from a word line driver across an SRAM array, the voltage drop along the length of word line may lower the word line signal voltage supplied to SRAM cells disposed farther away from the word line driver, resulting in reduced speed and increased power consumption. Accordingly, although existing SRAM devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure relates generally to memory systems, and more particularly, to static random-access memory (SRAM) systems. For advanced IC technology nodes, multi-gate transistors, such as fin-like field effect transistors (FinFETs) or gate-all-around (GAA) transistors, have become popular and promising candidates for high performance and low leakage applications. Memory arrays, such as SRAM arrays, may incorporate memory cells formed of FinFETs or GAA transistors in order to enhance performance or increase packing density, where each of memory cells can store a bit of data. As the dimensions of cells in an SRAM array shrink, word lines that provide an access signal to cells in the SRAM array also shrink in dimensions. Resistance in the smaller word lines increases, resulting in voltage drop along a length of a word line. When a word line driver is placed on one side of an SRAM array, a word line from the word line driver may supply an access signal to SRAM cells adjacent to the word line driver and a reduced access signal to cells away from the word line driver as a result of the voltage drop.

A memory system according to embodiments of the present disclosure includes a first word line driver disposed adjacent an end of an SRAM array and a second word line driver disposed adjacent the other end of the SRAM array. Each of the word lines is coupled to both the first word line driver and the second word line driver. When a word line is selected, the first word line driver feeds an access signal to the selected word line while the second word line driver supplies a feedback signal to the selected word line. The feedback signal comes from a charge recycle mechanism that collects charges from unselected SRAM cells via bit lines and bit line bars that are coupled to the unselected SRAM cells. The charge collected by the charge recycle mechanism would have been dissipated through leakage paths and gone into waste. That is, generation of the feedback signal does not require additional energy input. The feedback signal supplied by the second word line driver compensates for the voltage drop in the access signal due to resistance along a length of each of the word lines, thereby reducing RC (resistive-capacitive) delay and enhancing performance of memory system.

Figure 1:
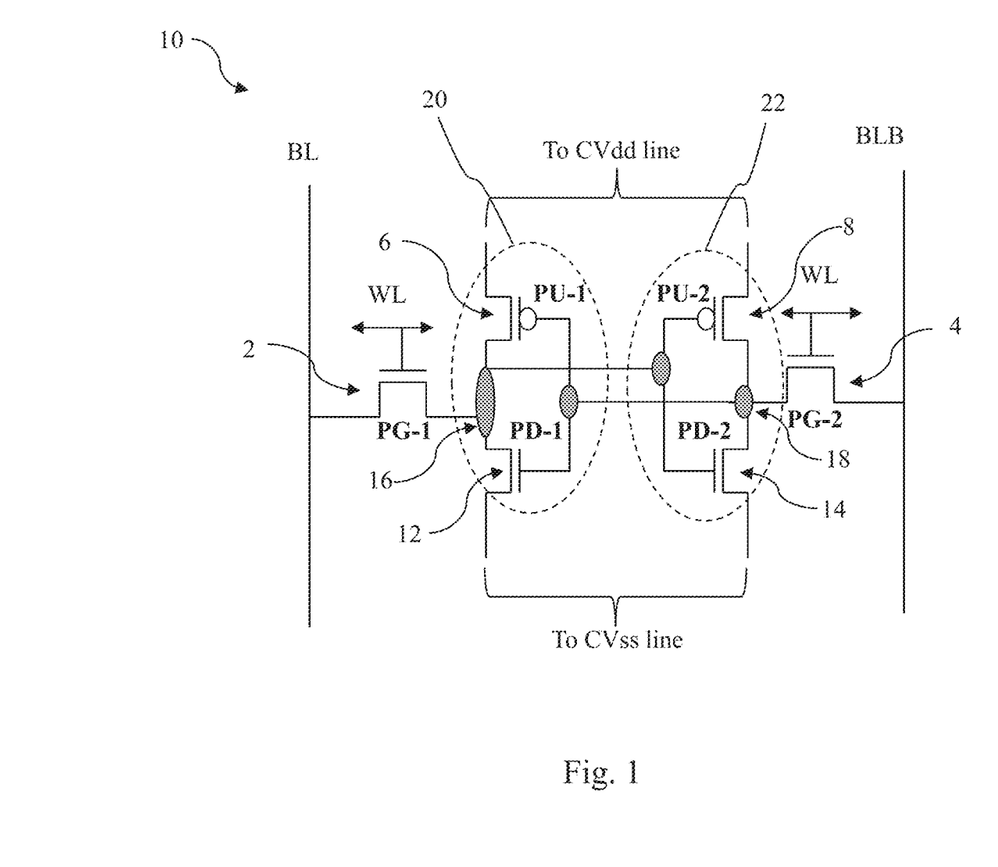
FIG. 1 illustrates a circuit diagram of an SRAM cell.

Static random-access memory (SRAM) is a type of volatile semiconductor memory that uses bi-stable latching circuitry to store each bit. Each bit in an SRAM is stored on four transistors (first pull-up transistor (PU-1), second pull-up transistor (PU-2), first pull-down transistor (PD-1), and second pull-down transistor (PD-2)) that form two cross-coupled inverters. This memory cell has two stable states which are used to denote 0 and 1. Two additional access transistors (first pass-gate transistor (PG-1) and second pass-gate transistor (PG-2)) serve to control the access to a storage cell during read and write operations. A typical SRAM cell includes six-transistors (6T) to store each memory bit. FIG. 1 illustrates a circuit diagram of a SRAM cell 10 in accordance with some embodiments of the present disclosure. In some instances, the SRAM cell 10 in FIG. 1 includes six (6) transistors and may be referred to as a single-port SRAM cell 10 or a 6T SRAM cell 10. It is noted, even though the embodiments of the present disclosure are described in conjunction with 6T SRAM cells, the present disclosure is not so limited. The present disclosure may be applicable to SRAM cells including more transistors, such as 7T, 8T, 9T, or 10T, that may be single-port, dual-port, or multi-port.

The SRAM cell 10 in FIG. 1 includes first and second pass-gate transistors (PG-1) 2 and (PG-2) 4, first and second pull-up transistors (PU-1) 6 and (PU-2) 8, and first and second pull-down transistors 12 (PD-1) and 14 (PD-2). In SRAM cell 10, each of the pass-gate transistors, pull-up transistors and pull-down transistors may be a multi-gate transistor, such as a GAA transistor. The gates of the first and second pass-gate transistors 2 and 4 are electrically coupled to a word line (WL) that determines whether the SRAM cell 10 is selected/activated or not. In the SRAM cell 10, a memory bit (e.g., a latch or a flip-flop) is formed of the first and second pull-up transistors 6 and 8 and the first and second pull-down transistors 12 and 14 to store a bit of data. The complementary values of the bit are stored in a first storage node 16 and a second storage node 18. The stored bit can be written into, or read from, the SRAM cell 10 through Bit-line (BL) and Bit-Line Bar (BLB). In this arrangement, the BL and BLB may carry complementary bit-line signals. The SRAM cell 10 is powered through a voltage bus CVdd that has a positive power supply voltage (Vdd) and is also connected to a ground potential bus CVss at ground potential (Vss).

The SRAM cell 10 includes a first inverter 20 formed of the first pull-up (PU-1) transistor 6 and the first pull-down transistor (PD-1) 12 as well as a second inverter 22 formed of the second pull-up transistor (PU-2) 8 and the second pull-down transistor (PD-2) 14. The first inverter 20 and the second inverter 22 are coupled between the voltage bus CVdd and the ground potential bus CVss. As shown in FIG. 1, the first inverter 20 and the second inverter 22 are cross-coupled. That is, the first inverter 20 has an input coupled to the output of the second inverter 22. Likewise, the second inverter 22 has an input coupled to the output of the first inverter 20. The output of the first inverter 20 is referred to as the first storage node 16. Likewise, the output of the second inverter 22 is referred to as the second storage node 18. In a normal operating mode, the first storage node 16 is in the opposite logic state as the second storage node 18. By employing the two cross-coupled inverters, the SRAM cell 10 can hold the data using a latched structure so that the stored data will not be lost without applying a refresh cycle as long as power is supplied through Vdd.

In operation, if the first and second pass-gate transistors (PG-1) 2 and (PG-2) 4 are inactive (not activated by the word line (WL)), the SRAM cell 10 will maintain/hold the complementary values at first and second storage nodes 16 and 18 indefinitely as long as power is provided through CVdd. This is so because each inverter of the pair of cross-coupled inverters drives the input of the other, thereby maintaining the voltages at the storage nodes 16 and 18. This situation will remain stable until the power is removed from the SRAM cell 10, or, a write cycle is performed to change the stored data at the storage nodes 16 and 18.

During a WRITE operation, bit line (BL) and bit line bar (BLB) are set to opposite logic values according to the new data that will be written into the SRAM cell 10. For example, in an SRAM write operation, a logic state "1" stored in a data latch of the SRAM cell 10 can be reset by setting BL to "0" and BLB to "1". In response to a binary code from a row decoder (not shown), a word line coupled to the first and second pass-gate transistors (PG-1) 2 and (PG-2) 4 of the SRAM cell 10 is asserted to select the memory cell and turn on the first and second pass-gate transistors (PG-1) 2 and (PG-2) 4. As a result, the first and second storage nodes 16 and 18 are connected to BL and BLB respectively. Furthermore, the first storage node 16 of the data latch is discharged by BL to "0" and the second storage node 18 of the data latch is charged by BLB to "1". As a result, the new data logic "0" is latched into the SRAM cell 10.

In a READ operation, both BL and BLB of the SRAM cell 10 are pre-charged to a voltage approximately equal to the operating voltage of the memory bank in which the SRAM cell 10 is located. In some instances, such operating voltage is the positive power supply voltage Vdd. In response to a binary code from the row decoder, a word line (WL) coupled to the first pass-gate transistor (PG-1) 2 and the second pass-gate transistor (PG-2) 4 of the SRAM cell 10 is asserted so that the data latch is selected to proceed to a READ operation.

During a READ operation, through a turned on first and second pass-gate transistors (PG-1) 2 and (PG-2) 4, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB is detected by a sense amplifier (shown in FIG. 3). Furthermore, the sense amplifier amplifies the differential voltage and reports the logic state of the memory cell via a data buffer. Put differently, the sense amplifier transforms the analog voltage differential into digital signals.

In an SRAM array formed of a plurality of the SRAM cells 10, the SRAM cells 10 are arranged in rows and columns. The columns of the SRAM array are formed by a bit line pairs, namely a bit line BL and a bit line bar BLB. The cells of the SRAM array are disposed between the respective bit line pairs. As shown in FIG. 1, the SRAM cell 10 is placed between the bit line BL and the bit line BLB. The first pass-gate transistor (PG-1) 2 is connected between the bit line BL and the output 16 (i.e. first storage node 16) of the first inverter 20. The second pass-gate transistor (PG-2) 4 is connected between the bit line bar BLB and the output 18 (i.e. second storage node 18) of the second inverter 22. The gates of the first pass-gate transistor (PG-1) 2 and the second pass-gate transistor (PG-2) 4 are connected to a word line (WL), which connects SRAM cells in a row of the SRAM array.

Figure 2:
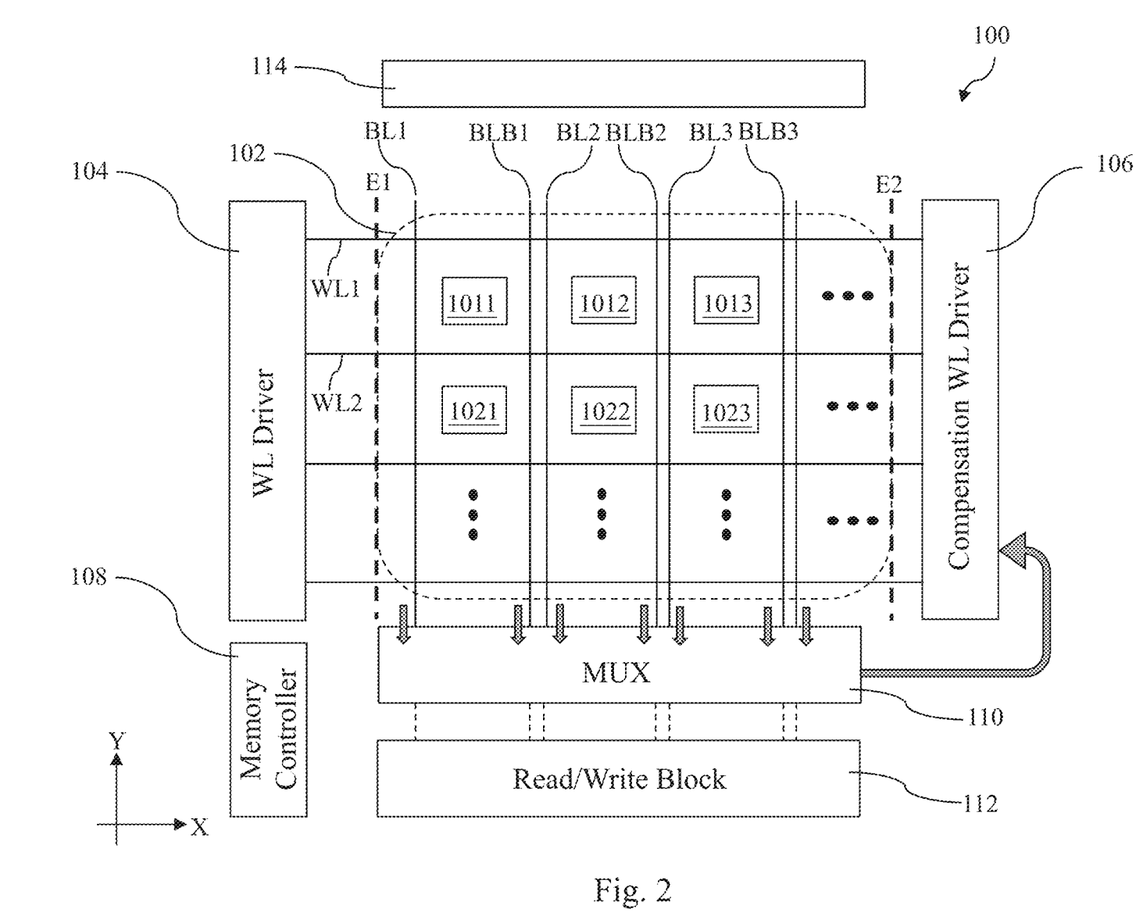
FIG. 2 illustrates a schematic diagram of a first memory system, according to aspects of the present disclosure.

Referring to FIG. 2, illustrated therein is a schematic diagram of a first SRAM system 100. The first SRAM system 100 includes an SRAM array 102, a word line driver 104, a compensation word line driver 106, a memory controller 108, a recycle multiplexer (MUX) 110, and a read/write block 112. The SRAM array 102 may include SRAM cells arranged in m rows that extend along the X direction and n columns that extend along the Y direction. That is, the SRAM array 102 may include (m*n) number of SRAM cells. For example, the SRAM array 102 includes 64 SRAM cells, 128 SRAM cells, or 256 SRAM cells. In some implementations, the SRAM array 102 is rectangular in shape and has a first end (E1) and an opposing second end (E2) along the X direction. In the embodiments represented in FIG. 2, only six SRAM cells 1011, 1012, 1013, 1021, 1022, and 1023 are shown for illustration purposes. As similarly described above with respect to the SRAM cell 10 in FIG. 1, each of the SRAM cells in the SRAM array 102 is coupled to a word line (WL), a bit line (BL), and a bit line bar (BLB). For example, the SRAM cell 1011 is coupled to the first word line (WL1), a first bit line (BL1), and a first bit line bar (BLB1); the SRAM cell 1012 is coupled to the first word line (WL1), a second bit line (BL2), and the second bit line bar (BLB2); the SRAM cell 1013 is coupled to the first word line (WL1), a third bit line (BL3), and the third bit line bar (BLB3); the SRAM cell 1021 is coupled to the second word line (WL2), a first bit line (BL1), and a first bit line bar (BLB1); the SRAM cell 1022 is coupled to the second word line (WL2), a second bit line (BL2), and the second bit line bar (BLB2); and the SRAM cell 1023 is coupled to the second word line (WL2), a third bit line (BL3), and the third bit line bar (BLB3). The SRAM array 102 may be regarded as including m rows of SRAM cells or n columns of SRAM cells. Each row of SRAM cells is coupled to a common word line and each column of SRAM cells are coupled to a common bit line and a common bit line bar. In some embodiments represented in FIG. 2, the SRAM cells 1011, 1012, and 1013, which are disposed in a row along the X direction, are coupled to the first word line WL1. Similarly, the SRAM cells 1021, 1022, and 1023, which are disposed in a row along the X direction, are coupled to the second word line WL2. The SRAM cells 1011 and 1021, which are disposed in a column along the Y direction, are coupled to the first bit line (BL1) and the first bit line bar (BLB1). The SRAM cells 1012 and 1022, which are disposed in a column along the Y direction, are coupled to the second bit line (BL2) and the second bit line bar (BLB2). The SRAM cells 1013 and 1023 are coupled to the third bit line (BL3) and the third bit line bar (BLB3). The row-wise sharing of word lines continues for each of the m rows of SRAM cells and the column-wise sharing of pairs of bit line and bit line bars continues for each of the n columns of SRAM cells. As such, each of the SRAM cells may be addressed by selecting a respective word line and a respective pair of bit lines. For example, the SRAM cell 1011 may be addressed by activating the first word line (WL1) and selecting the first bit line (BL) and the first bit line bar (BLB1).

Referring still to FIG. 2, each of the word lines is coupled to and driven by the word line driver 104 disposed adjacent (or near) the first end (E1) as well as the compensation word line driver 106 disposed adjacent (or near) the second end (E2). That is, an end of each of the word lines is coupled to the word line driver 104 to receive an access signal and the other end of each of the word lines is coupled to the compensation word line driver 106 to receive a feedback signal. As will be described below, because the word line driver 104 and the compensation word line driver 106 are synchronized to select the same group of word lines, the feedback signal supplied by the compensation word line driver 106 compensates for the resistively reduced access signal provided by the word line driver 104.

The memory controller 108 controls the operation of the word line driver 104, the compensation word line driver 106, the recycle multiplexer 110, and the read/write block 112. One or more of the SRAM cells in the SRAM array 102 may be addressed by a row number signal and a column number signal. The row number signal is sent from the memory controller 108 to the word line driver 104 and the compensation word line driver 106 to select a row of SRAM cells via one of the word lines. The column number signal is sent to the read/write block 112 to select a column via one of the bit line/bit line bar pairs. An SRAM cell at a cross point of the selected row and selected column is then selected or addressed. For example, to read a bit stored at the SRAM cell 1011, an access signal is fed to the first word line WL1 to provide access to (or activate) the row of SRAM cells in which the SRAM cell 1011 is disposed. The bit stored at the SRAM cells is then read via the first bit line BL and the first bit line bar BLB1. To write a bit stored to the SRAM cell 1011, an access signal is fed to the first word line WL1 to provide access to (or activate) the row of SRAM cells in which the SRAM cell 1011 is disposed. An input data signal is written into the SRAM cell 1011 via the first bit line BL and the first bit line bar BLB1. The same holds true to the SRAM cells 1012, 1013, 1021, 1022, and 1023 as well.

Figure 3:
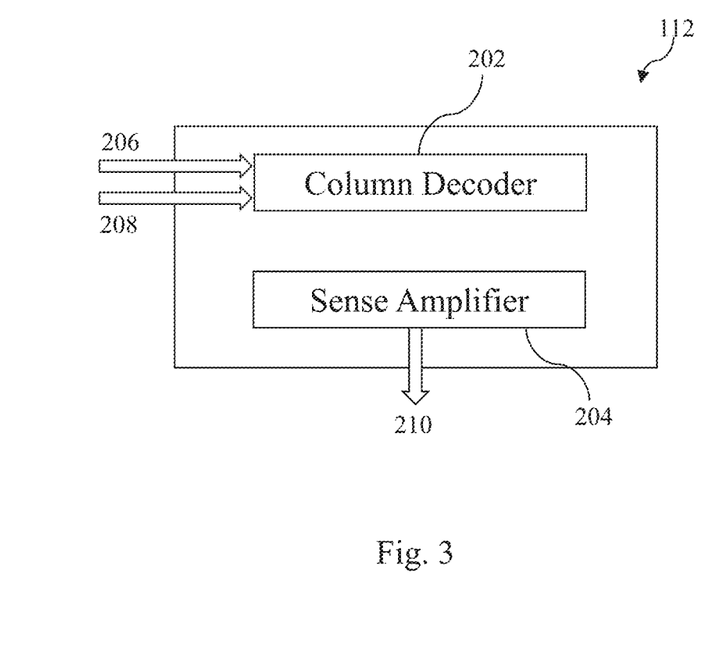
FIG. 3 illustrates a schematic diagram of a read/write block, according to aspects of the present disclosure.

Each of the bits lines, such as first bit line (BL1), the second bit line (BL2) and the third bit line (BL3), and each of bit line bars, such as the first bit line bar (BLB1), the second bit line bar (BLB2), and the third bit line bars (BLB3) are coupled to the read/write block 112. Reference is now made to FIG. 3, which illustrates a more detailed schematic diagram of the read/write block 112. In some embodiments represented in FIG. 3, the read/write block 112 includes a column decoder 202. The column decoder 202 operates to select a pair of bit line and bit line bar based on a column number signal 206 from the memory controller 108. In some embodiments shown in FIG. 3, the column decoder 202 may also receive input data 208 during a WRITE operation and feed the same to the selected memory cells. The read/write block 112 further includes a sense amplifier 204 to detect the differential voltage between BL and BLB during a READ operation. The sense amplifier 204 may amplify the differential voltage and reports a logic state 210 (output data 210) of the memory cell via a data buffer.

In some embodiments illustrated in FIG. 2, the first SRAM system 100 includes a pre-charge circuit 114 to pre-charge all the bit lines, all the bit line bars, or both. In some instances, the pre-charge circuit 114 pre-charges all the bit lines, all the bit line bars, or both to positive power supply voltage Vdd. The pre-charge circuit 114 may be coupled to the memory controller 108 to receive an enabling signal. The enabling signal from the memory controller 108 may turn on one or more transistors in the pre-charge circuit 114 to connect the bit lines, bit line bars, or both to a power line or power rail at Vdd. Conventionally, bit lines and bit line bars that are charged by the pre-charge circuit 114 to Vdd are allowed to discharge to a lower voltage or ground potential Vss. Bit lines and bit line bars of the selected SRAM cells are allowed to discharge via the pull-down transistors. Bit lines and bit line bars of memory cells that are not selected by the read/write block 112 are supposed to be floating but in reality, charges stored therein are likely to dissipate through leakage paths in the first SRAM system 100. That is, charges in pre-charged bit lines and bit line bars of unselected SRAM cells in conventional SRAM systems may go to waste.

SRAM systems according to the present disclosure include a charge recycle mechanism that collects charge from bit lines and bit line bars of SRAM cells that are not selected and directs the collected charges to the compensation word line driver 106. In some embodiments represented in FIG. 2, the charge recycle mechanism includes the recycle multiplexer 110 coupled to the compensation word line driver 106. Each of the bits lines, such as first bit line (BL1), the second bit line (BL2) and the third bit line (BL3), and each of bit line bars, such as the first bit line bar (BLB1), the second bit line bar (BLB2), and the third bit line bars (BLB3) are also coupled to the recycle multiplexer (MUX) 110. The recycle multiplexer 110 is coupled to the memory controller 108. The memory controller 108 may send an inverse of the column number signal to the recycle multiplexer 110 such that the recycle multiplexer 110 may be electrically coupled to memory cells that are not selected by the read/write block 112. In some implementations, the memory controller 108 send the same column number signal to both read/write block 112 and the recycle multiplexer 110 but the column number signal is inversed by the recycle multiplexer 110 or a separate inverter circuitry such that the recycle multiplexer 110 may be electrically coupled to memory cells that are not selected by the read/write block 112. In some other implementations, the recycle multiplexer 110 is electrically coupled to a subset of the unselected bit lines and bit line bars, instead of the entirety of the unselected bit lines and bit line bars. The charge collected by the recycle multiplexer 110 serves as the power source for the compensation word line driver 106 such that the collected charge is redirected to the selected word lines that are coupled to the compensation word line driver 106. Put differently, the recycle multiplexer 110 and the compensation word line driver 106 operate together to redirect charges that would go to waste to far/remote ends (with respect to the word line driver 104) of selected word lines to compensate for voltage drop due to resistance. As described above, the word line driver 104 and the compensation word line driver 106 both receive the row number signal from the memory controller 108 and are synchronized to select the same group of word lines. That way, this group of word lines are coupled to the word line driver 104 at the first end (E1) and to the compensation word line driver 106 at the second end (E2). The word line driver 104 draws power directly from the positive power supply voltage Vdd while the compensation word line driver 106 draws power from the recycled charge collected by the charge recycle mechanism (i.e., the recycle multiplexer 110 in FIG. 2). Instead of being driven by a single word line driver in the conventional setting, each of the selected word lines in the first SRAM system 100 is driven by a first word line driver (i.e., the word line driver 104) at one end (i.e., the first end (E1)) and a second word line driver (i.e., the compensation word line driver 106) at the other end (i.e., the second end (E2)).

Figure 4:
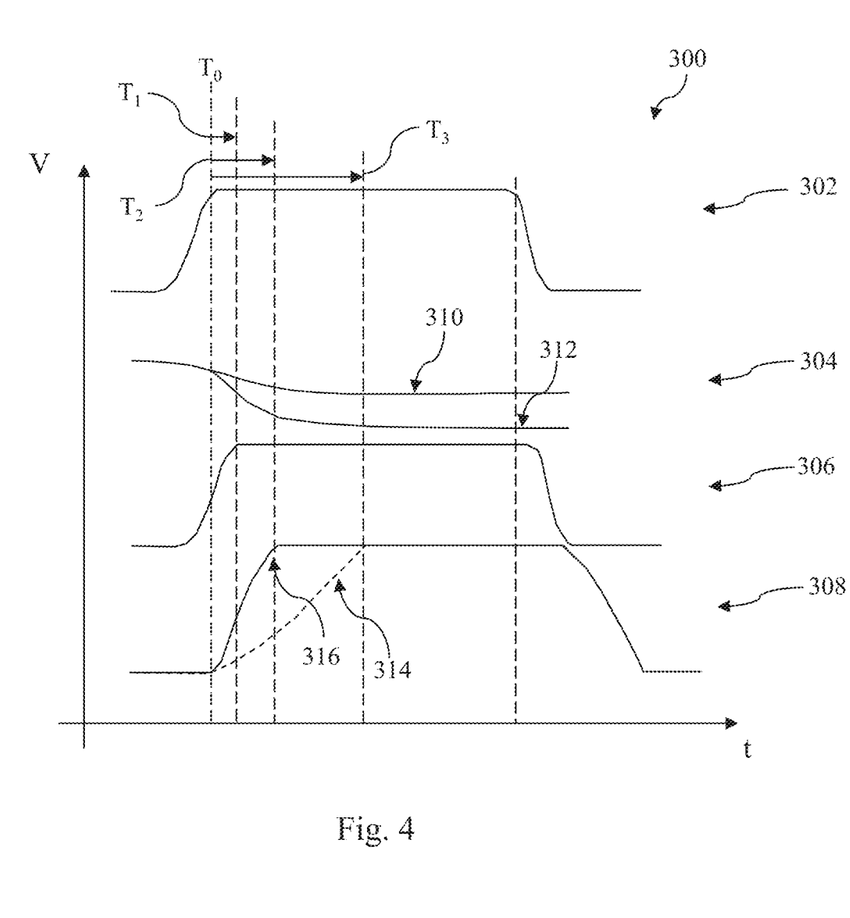
FIG. 4 illustrates a schematic diagram of voltage signals in a word line driver, a word line, a bit line, and a bit line bar over time, according to aspects of the present disclosure.

Some benefits of embodiments of the present disclosure are described in conjunction with FIG. 4, which illustrates time series 300 of voltages at the word line driver 104, bit lines/bit line bars, access signal towards the first end (E1), and access signal towards the second end (E2). The first time series 302 represents the access signal at the word line driver 104 over time. The second time series 304 represents the voltage at the unselected bit lines/bit line bars over time. The third time series 306 represents the access signal at a memory cell near the first end (E1), which is adjacent the word line driver 104. The fourth time series 308 represents the access signal at a memory cell near the second end (E2), which is adjacent the compensation word line driver 106. As shown in the first time series 302 in FIG. 4, the access signal at the word line driver 104 changes from "0" to "1" at $T_0$ as the word line driver 104 sends the access signal down the selected word line(s). Due to the resistance in the selected word line(s), the access signal that reaches an SRAM cell near the first end (E1) experience little or no resistive-capacitive delay (RC delay) while the access signal that reaches an SRAM cell adjacent the second end (E2) experience a more pronounced RC delay. As illustrated in FIG. 4, the third time series 306 changes from "0" to "1" at $T_1$, which is small and acceptable. Without the charge recycle mechanism of the present disclosure, the access signal at an SRAM cell near the second end (E2) experiences significant RC delay. Accordingly, the fourth time series 308 tracks a shallow curve 314 and changes from "0" to "1" at $T_3$. However, when the charge recycle mechanism of the present disclosure is implemented, the access signal at an SRAM cell near the second end (E2) is supplemented by recycled charges supplied by the compensation word line driver 106. As a result, the fourth time series 308 tracks a steep curve 316 and changes from "0" to "1" at $T_2$. The RC delay at an SRAM cell near the first end (E1) may be represented as a difference between $T_1$ and $T_0$ ($T_1-T_0$). The RC delay at an SRAM cell near the second end (E2) without the charge recycle mechanism may be represented as a difference between $T_3$ and $T_0$ ($T_3-T_0$). The RC delay at an SRAM cell near the second end (E2) with the charge recycle mechanism may be represented as a difference between $T_2$ and $T_0$ ($T_2-T_0$). ($T_3-T_0$) is greater than ($T_2-T_0$). ($T_2-T_0$) may be equal to or greater than ($T_1-T_0$). It has been observed that when the time delay is shortened (i.e., from ($T_3-T_0$) to ($T_2-T_0$)), the speed of the SRAM system may be increased by between about 5% and about 15%, including about 10%.

Depending on whether an unselected SRAM cell(s) is accessed by the word line, the voltage at a bit line or a bit line bar may dissipate differently. For avoidance of any doubts, each of the SRAM cells in the SRAM array 102 is selected when it is addressed by a row number and a column number. An SRAM cell is not selected, however, if any of its word line or bit line/bit line bar pair is not selected. Therefore, when a word line is energized by the word line driver 104 to provide access to (or activate) a row of SRAM cells, an SRAM cell in this row of SRAM cells is not selected unless its bit line and bit line bar pair are also selected by the read/write block 112. Compared to an SRAM cell that is not accessed by a selected word line, an SRAM cell that is accessed by an access signal in a word line includes additional charge dissipation paths through turned-on pass-gate transistors. As shown in FIG. 4, the second time series 304 drops along a shallow curve 310 when the bit line and bit line bar are not allowed to dissipate through the pass-gate transistors. As a comparison, the second time series 304 drops faster along a steep curve 312 when the bit line and bit line bar are allowed to dissipate through the pass-gate transistors turned on by the selected word line.

Figure 5:
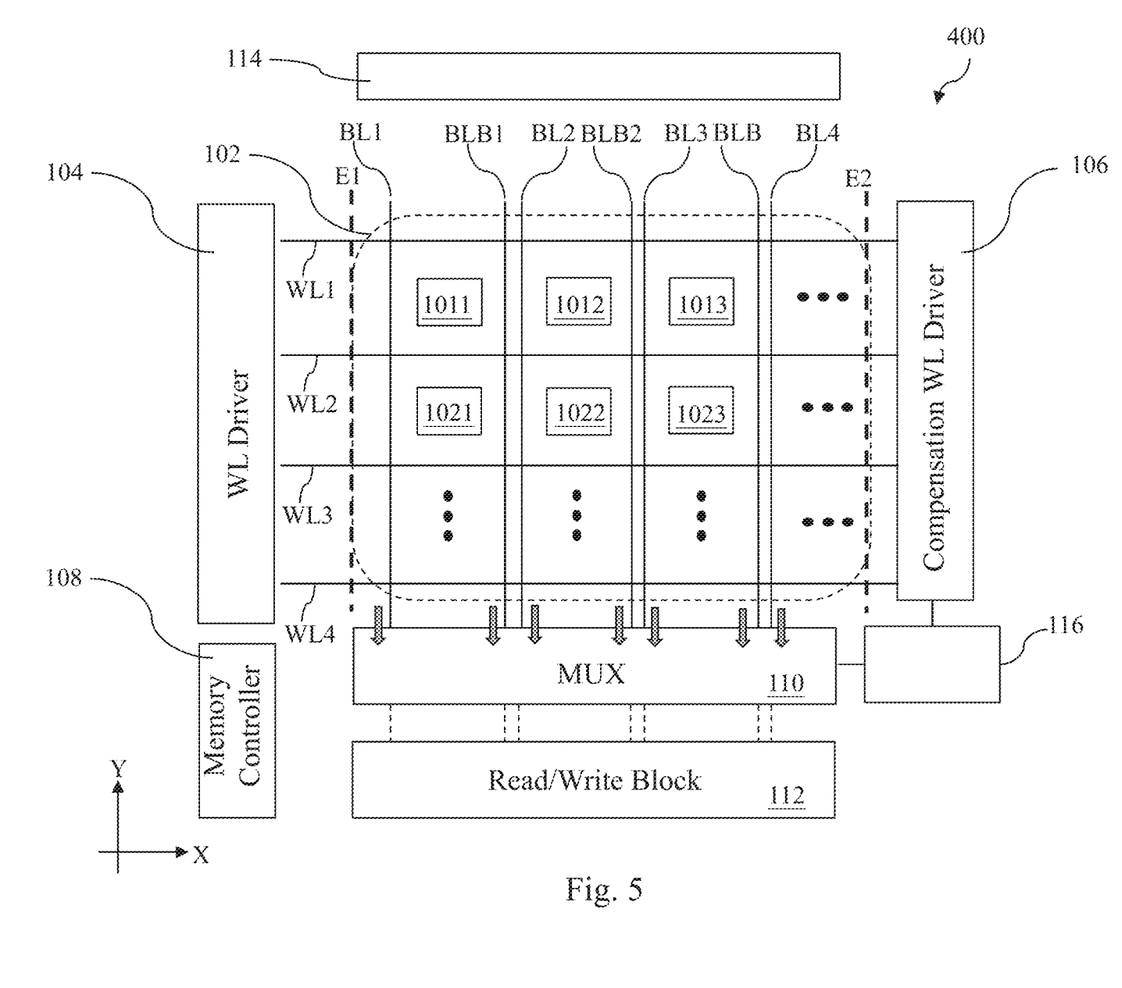
FIG. 5 illustrates a schematic diagram of a second memory system, according to aspects of the present disclosure.

FIG. 5 illustrates a second SRAM system 400 according to the present disclosure. As compared to the first SRAM system 100 in FIG. 2, the second SRAM system 400 further includes a feedback controller 116. In the second SRAM system 400, the feedback controller 116 may be viewed as a part of the charge recycle mechanism, which also includes the recycle multiplexer. Throughout the present disclosure, like numbers denote like features. Descriptions of features in the second SRAM system 400 having similar reference numerals as in the first SRAM system 100 will not be repeated here for brevity. In some embodiments represented in FIG. 5, the feedback controller 116 allows selective engagement of the compensation word line driver 106 and regulates recycled charges fed to the compensation word line driver 106. In some implementations, the feedback controller 116 is coupled to the memory controller 108. In those implementations, when the memory controller 108 sends an enabling signal to the feedback controller 116, the feedback controller 116 may be turned on to direct the collected charge at the recycle multiplexer 110 to the compensation word line driver 106. That is, when the feedback controller 116 is enabled, the second SRAM system 400 operates just like the first SRAM system 100. When the feedback controller 116 is disabled, the connection between the recycle multiplexer 110 and the compensation word line driver 106 is severed and the second SRAM system 400 operates more like a conventional SRAM system.

Figure 6:
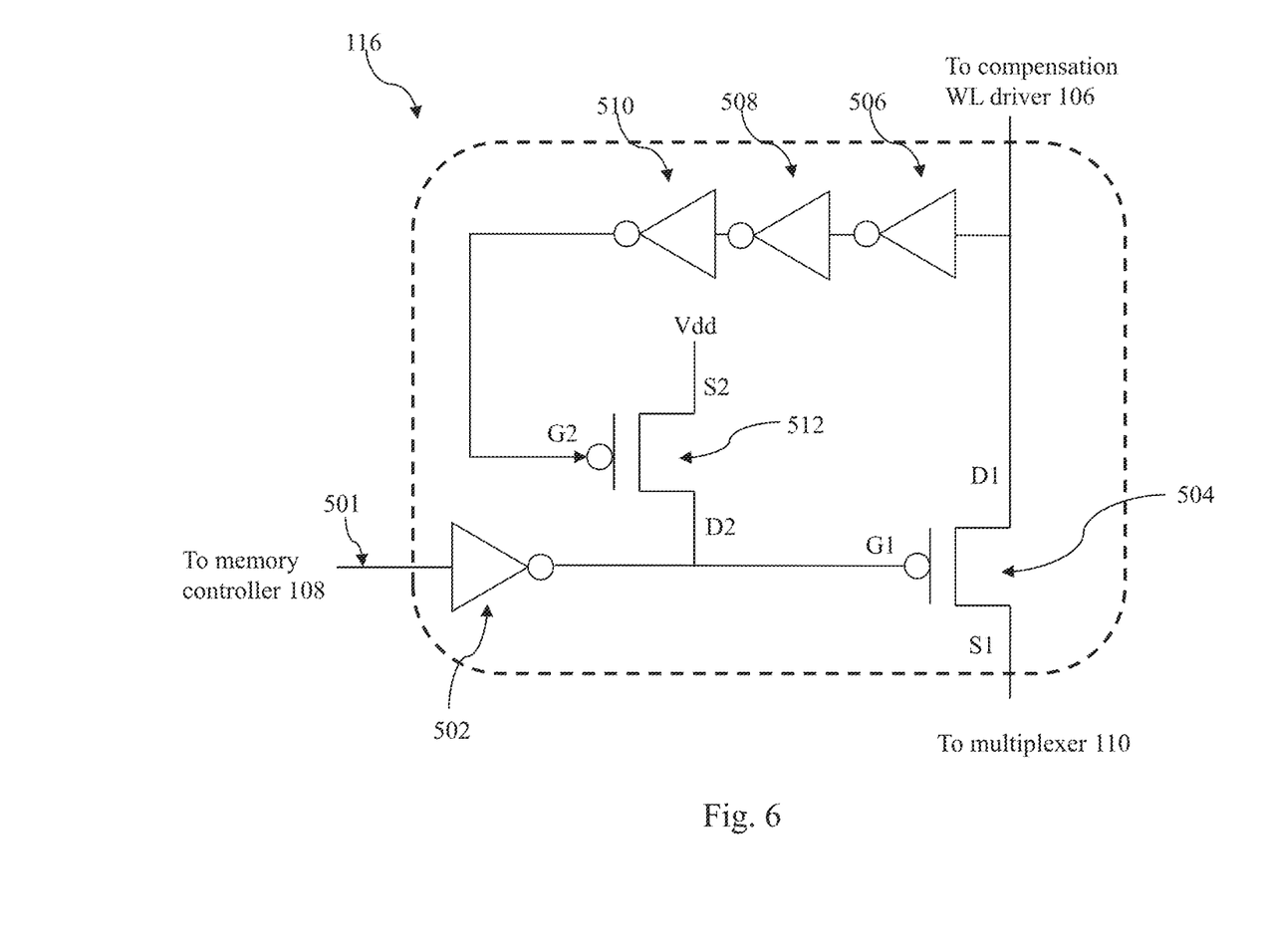
FIG. 6 illustrates a schematic diagram of a feedback controller, according to aspects of the present disclosure.

Reference is now made to FIG. 6, which illustrates an embodiment of the feedback controller 116. As illustrated in FIG. 6, the feedback controller 116 includes a first inverter 502, a first p-type transistor 504, a second inverter 506, a third inverter 508, a fourth inverter 510, and a second p-type transistor 512. Each of the first inverter 502, the second inverter 506, the third inverter 508, and the fourth inverter 510 includes an input and an inverse output. The first p-type transistor 504 includes a first gate G1, a first drain D1 and a first source S1. The second p-type transistor 512 includes a second gate G2, a second drain D2 and a second source S2. In some embodiments, the input of the first inverter 502 is coupled to the memory controller 108 to receive an enabling signal 501. The output of the first inverter 502 is coupled to the second drain D2 of the second p-type transistor 512 and the first gate G1 of the first p-type transistor 504. The first source S1 of the first p-type transistor 504 is coupled to the recycle multiplexer 110 to receive the charges recycled from the unselected bit lines and bit line bars. The first drain D1 of the first p-type transistor 504 is coupled to the compensation word line driver 106 and the input of the second inverter 506. The output of the second inverter 506 is coupled to the input of the third inverter 508. The output of the third inverter 508 is coupled to the input of the fourth inverter 510. The output of the fourth inverter 510 is coupled to the second gate G2 of the second p-type transistor 512. The second source S2 is coupled to the positive power source voltage Vdd.

Without the enabling signal 501, the output of the first inverter 502 is at "1", which does not turn on the first gate G1 of the first p-type transistor 504. With the first p-type transistor 504 turned off, the connection between the recycle multiplexer 110 and the compensation word line driver 106 is cut off and the compensation word line driver 106 does not provide any signal to the selected word lines. When the memory controller 108 feeds the enabling signal 501 to the first inverter 502, the inverted output of the first inverter 502 turns on the first gate G1 of the first p-type transistor 504 to connect the output of the recycle multiplexer 110 to the compensation word line driver 106 and the compensation word line driver 106 supplies the recycled charge to the selected word lines from the second end (E2). In other words, when the first p-type transistor 504 is turned on, the charge recycle mechanism of the present disclosure kicks in to compensate for the RC delay in the selected word lines. When the voltage at the compensation word line driver 106 rises to a level near Vdd ("1"), the "1" signal may be inverted by the second inverter 506 to output to a "0" signal to the third inverter 508, which inverts the "0" signal to "1". The "1" signal from the output of the third inverter 508 is then fed to the fourth inverter 510 to generate a "0" signal. The "0" signal from the output of the fourth inverter 510 turns on the second gate G2 of the second p-type transistor 512, thereby connecting the second source S2 and the second drain D2. The Vdd at the second source S2 is an "1" signal that turns off the first gate G1, shutting down the charge recycle mechanism. It can be seen that when the voltage at the compensation word line driver 106 (i.e., access signal voltage near the second end (E2)) is high (i.e., "1"), the charge recycle mechanism is shut down. However, when the voltage at the compensation word line driver 106 (i.e., access signal voltage near the second end (E2)) is low (i.e., "0") and the feedback controller 116 is enabled by the enabling signal 501, the recycle multiplexer 110 is allowed to send collected charge to the compensation word line driver 106. The serial connection of the second inverter 506, the third inverter 508, and the fourth inverter 510 may provide propagation delay, preventing erratic operation of the charge recycle mechanism.

While the FIG. 6 provides a detailed description of an embodiment of the feedback controller 116, the present disclosure contemplates other embodiments of the feedback controller 116. For example, the feedback controller 116 may include more or less inverters, different types of transistors, more or less p-type transistors, or other logic gates or circuitry. In some implementations, the feedback controller 116 may have less components. For example, the second inverter 506, the third inverter 508, the fourth inverter 510, and the second p-type transistor 512 may be omitted such that the operation of the feedback controller 116 is governed solely by the memory controller 108. For another example, the third inverter 508 and the fourth inverter 510 may be omitted. In some other implementations, the feedback controller 116 may have more components. For example, the feedback controller 116 may include a capacitor to store the charges recycled by the recycle multiplexer 110 and release the stored charges when enabled by the memory controller 108.

Figure 7:
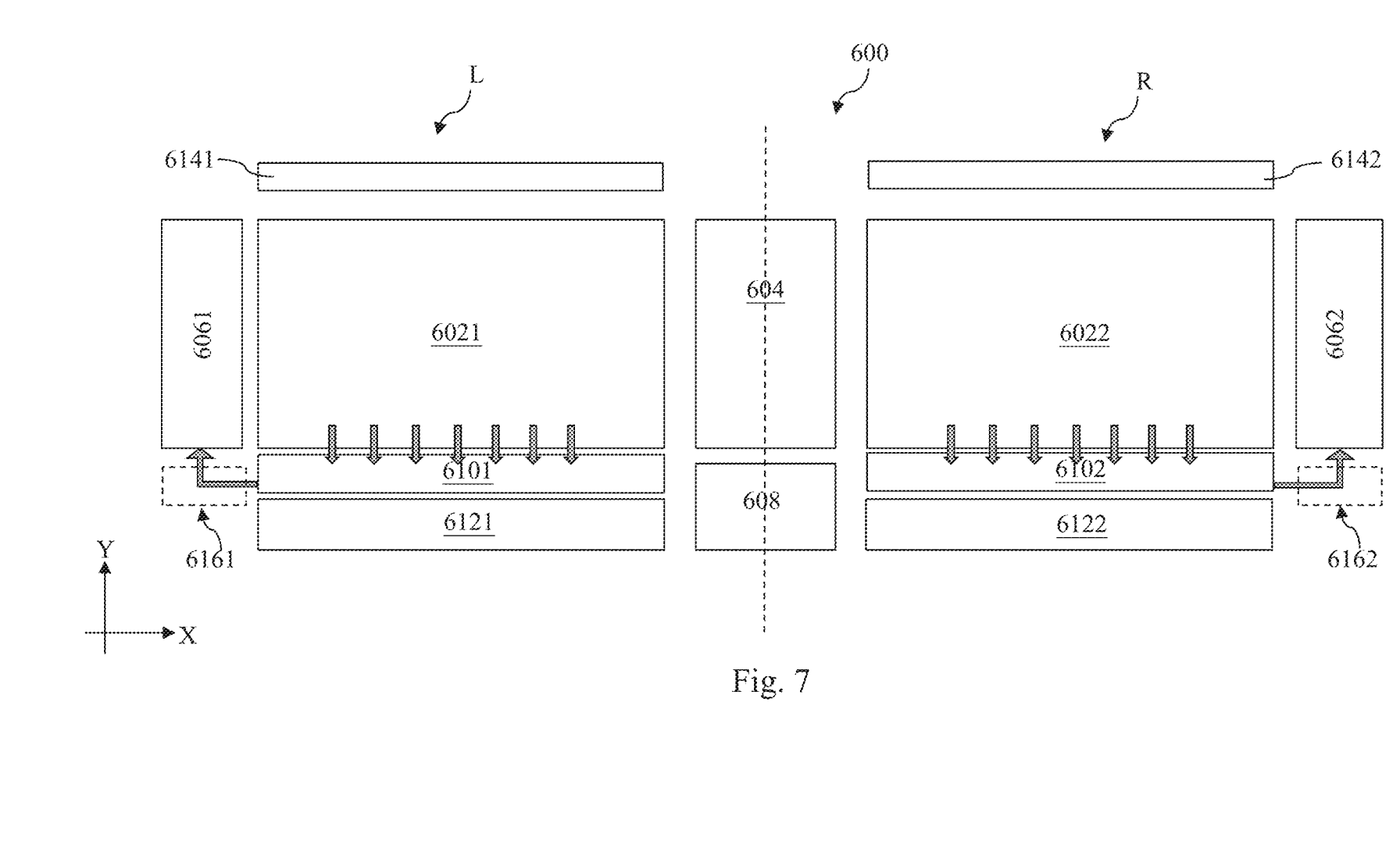
FIG. 7 illustrates a schematic diagram of a third memory system, according to aspects of the present disclosure.

FIG. 7 illustrates a third SRAM system 600. In some embodiments, the third SRAM system 600 includes a word line driver 604, a memory controller 608, a first SRAM array 6021, a second SRAM array 6022, a first recycle multiplexer 6101, a second recycle multiplexer 6102, a first read/write block 6121, a second read/write block 6122, a first compensation word line driver 6061, the second compensation word line driver 6062, a first pre-charge circuit 6141, and a second pre-charge circuit 6142. In some alternative embodiments, the third SRAM system 600 may optionally include a first feedback controller 6161 and a second feedback controller 6162. As shown in FIG. 7, the third SRAM system 600 includes a first half L and a second half R, each of which operates like the first SRAM system 100 without the feedback controllers (6161 and 6162) and operates like the second SRAM system 400 with the feedback controllers (6161 and 6162). The word line driver 604 and the memory controller 608 are configured such that the first SRAM array 6021 and the second SRAM array 6022 may be read or written independently. Each of the first half L and the second half R includes a charge recycle mechanism. With respect to the first half L, the charge recycle mechanism includes the first recycle multiplexer 6101 that is coupled to the first compensation word line driver 6061. With respect to the second half R, the charge recycle mechanism includes the second recycle multiplexer 6102 that is coupled to the second compensation word line driver 6062. The word lines that extend across the first SRAM array 6021 are coupled to both the first compensation word line driver 6061 and the word line driver 604. Similarly, the word lines that extend across the second SRAM array 6022 are coupled to both the second compensation word line driver 6062 and the word line driver 604. The first compensation word line driver 6061 and the second compensation word line driver 6062 supply recycled charges to selected word lines the ends that are away from the word line driver 604.

Embodiments of the present disclosure provide benefits. A memory system according to embodiments of the present disclosure includes a first word line driver disposed adjacent an end of an SRAM array and a second word line driver disposed adjacent the other end of the SRAM array. Each of the word lines is coupled to both the first word line driver and the second word line driver. When a word line is selected, the first word line driver feeds an access signal to the selected word line while the second word line driver supplies a feedback signal to the selected word line. The feedback signal comes from a charge recycle mechanism that collects charges from unselected SRAM cells via their bit lines and bit line bars by a recycle multiplexer. The collected charges power the second word line driver to generate the feedback signal. Generation of the feedback signal does not require additional energy input. The feedback signal supplied by the second word line driver compensates for the voltage drop in the access signal due to resistance along a length of each of the word lines, thereby reducing RC (resistive-capacitive) delay and enhancing performance of memory system.

The present disclosure provides for many different embodiments. In one embodiment, a memory device is provided. The memory device includes a word line driver coupled to a plurality of word lines, a recycle multiplexer coupled to a plurality of bit lines and a plurality of bit line bars, a memory cell array, and a compensation word line driver. The memory cell array includes a first end adjacent the word line driver, a second end away from the word line driver, and a plurality of memory cells, each of which is coupled to one of the plurality of word lines, one of the plurality of bit lines, and one of the plurality of bit line bars. The compensation word line driver is disposed adjacent the second end of the memory cell array and coupled to the plurality of word lines. The recycle multiplexer is configured to selectively couple one or more of the plurality of bit lines or one or more of the plurality of bit line bars to the compensation word line driver.

In some embodiments, the memory device further includes a read/write block coupled to the plurality of memory cells via the plurality of bit lines and the plurality of bit line bars, and a memory controller electrically coupled to the word line driver, the recycle multiplexer, the compensation word line driver, and the read/write block. The memory controller is configured to cause the word line driver to activate a set of word lines out of the plurality of word lines, cause the compensation word line driver to couple to the set of word lines, cause the read/write block to read or write a first set of memory cell out of the plurality of memory cells via a first group of bit lines out of the plurality of bit lines and a first group of bit line bars out of the plurality of bit line bars, and cause the recycle multiplexer to couple to a second set of memory cells out of the plurality of memory cells via a second group of bit lines out of the plurality of bit lines and a second group of bit line bars out of the plurality of bit line bars, the second set of memory cells being different from the first set of memory cell.

In some embodiments, each of the plurality of bit lines and the plurality of bit line bars is electrically coupled to a pre-charge circuit to be pre-charged to a positive power supply voltage (Vdd). In some embodiments, when the memory controller causes the recycle multiplexer to couple to the second set of memory cells, the second group of bit lines and the second group of bit line bars are coupled to the compensation word line driver. In some implementations, the read/write block includes a column decoder coupled to the plurality of bit lines and the plurality of bit line bars, and a sense amplifier coupled to the plurality of bit lines and the plurality of bit line bars. In some instances, the memory device further includes a feedback controller coupled to the recycle multiplexer and the compensation word line driver. The feedback controller is configured to regulate an access signal from the compensation word line driver to the set of word lines. In some embodiments, the feedback controller is coupled to the memory controller, the memory controller is configured to send an enabling signal to the feedback controller to activate the feedback controller, and the feedback controller is configured to couple the recycle multiplexer to the second set of memory cells when activated.

In another embodiment, a memory device is provided. The memory device includes a first word line driver coupled to a plurality of word lines and drawing power from a first source, a second word line driver coupled to the plurality of word lines and drawing power from a second source different from the first source, and a memory cell array sandwiched between the first word line driver and the second word line driver. The memory cell array includes a plurality rows of memory cells, each of the plurality rows of memory cells being coupled to one of the plurality of word lines. In some embodiments, the memory device further includes a plurality of bit lines and a plurality of bit line bars. The memory cell array includes a plurality columns of memory cells, each of the plurality columns of memory cells being coupled one of the plurality of bit lines and one of the plurality of bit line bars. In some implementations, the memory device further includes a recycle multiplexer coupled to the plurality of bit lines and the plurality of bit line bars. In some instances, the memory device further includes a read/write block coupled to the plurality of bit lines and the plurality of bit line bars. In some embodiments, the read/write block includes a column decoder coupled to the plurality of bit lines and the plurality of bit line bars, and a sense amplifier coupled to the plurality of bit lines and the plurality of bit line bars. In some implementations, the memory device further includes a memory controller electrically coupled to the first word line driver, the recycle multiplexer, the second word line driver, and the read/write block. The memory controller is configured to cause the first word line driver to activate a row of word lines out of the plurality of word lines, cause the second word line driver to couple to the row of word lines, cause the read/write block to read or write a first set of memory cell out of the plurality rows of memory cells, and cause the recycle multiplexer to couple to a second set of memory cells out of the plurality rows of memory cells, the second set of memory cells being different from the first set of memory cell. In some implementations the memory device may further include a feedback controller coupled to the recycle multiplexer and the second word line driver. The feedback controller is configured to couple the recycle multiplexer and the second word line driver in response to an enabling signal from the memory controller.

In still another embodiment, the memory device includes a memory cell array, a first word line driver, a second word line driver, and a charge recycle mechanism. The memory cell array includes a plurality of word lines extending along a first direction from a first end of the memory cell array to a second end of the memory cell array, a plurality of bit lines extending along a second direction perpendicular to the first direction, a plurality of bit line bars extending along the second direction, and a plurality of memory cells, each of which is coupled to one of the plurality of word lines, one of the plurality of bit lines, and one of the plurality of bit line bars. The first word line driver is adjacent the first end of the memory cell array and is coupled to the plurality of word lines. The second word line driver is adjacent the second end of the memory cell array and is coupled to the plurality of word lines. The charge recycle mechanism is coupled to the plurality of bit lines, the plurality of bit line bars, and the second word line driver.

In some embodiments, the memory device may further include a read/write block coupled to the plurality of memory cells via the plurality of bit lines and the plurality of bit line bars, and a memory controller electrically coupled to the first word line driver, the second word line driver, and the read/write block. The memory controller is configured to cause the first word line driver to activate a set of word lines out of the plurality of word lines, cause the second word line driver to couple to the set of word lines, cause the read/write block to couple a first group of bit lines out of the plurality of bit lines and a first group of bit line bars out of the plurality of bit line bars, and cause the charge recycle mechanism to couple to a second group of bit lines out of the plurality of bit lines and a second group of bit line bars out of the plurality of bit line bars to collect charges in the second group of bit lines and the second group of bit line bars. The first group of bit lines are different from the second group of bit lines and the first group of bit line bars are different from the second group of bit line bars. In some implementations, the charge recycle mechanism includes a recycle multiplexer coupled to the plurality of bit lines and the plurality of bit line bars, and a feedback controller coupled to the recycle multiplexer and the second word line driver and configured to control electrical coupling between the recycle multiplexer and the second word line driver. In some instances, the feedback controller includes a first inverter including a first input and first output, a second inverter including a second input and a second output, a first p-type transistor including a first gate, a first source, and a first drain, and a second p-type transistor including a second gate, a second source, and a second drain. The first input of the first inverter is coupled to the memory controller. The first output of the first inverter is coupled to the first gate. The first source is coupled to the recycle multiplexer. The first drain is coupled to the second word line driver. The second input of the second inverter is coupled to second word line driver. The second output of the second inverter is coupled to the second gate. The second source is coupled to a positive power supply voltage (Vdd) and the second drain is coupled to the first gate. In some instances, the memory controller is electrically coupled to the recycle multiplexer and the feedback controller. In some embodiments, the memory controller is configured to send an enabling signal to the feedback controller to activate the feedback controller and the feedback controller is configured to couple the recycle multiplexer to the second group of bit lines and the second group of bit line bars when activated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a word line driver coupled to a plurality of word lines;
   a recycle multiplexer coupled to a plurality of bit lines and a plurality of bit line bars;
   a memory cell array comprising:
      a first end adjacent the word line driver,
      a second end away from the word line driver, and
      a plurality of memory cells, each of which is coupled to one of the plurality of word lines, one of the plurality of bit lines, and one of the plurality of bit line bars; and
   a compensation word line driver disposed adjacent the second end of the memory cell array and coupled to the plurality of word lines,
   wherein the recycle multiplexer is configured to selectively couple one or more of the plurality of bit lines or one or more of the plurality of bit line bars through an output of the recycle multiplexer to an input of the compensation word line driver,
   wherein each of the plurality of word lines is coupled to and driven by both the word line driver and the compensation word line driver.

2. The memory device of claim 1, further comprising:
   a read/write block coupled to the plurality of memory cells via the plurality of bit lines and the plurality of bit line bars; and
   a memory controller electrically coupled to the word line driver, the recycle multiplexer, the compensation word line driver, and the read/write block,
   wherein the memory controller is configured to:
      cause the word line driver to activate a set of word lines out of the plurality of word lines,
      cause the compensation word line driver to couple to the set of word lines,
      cause the read/write block to read or write a first set of memory cell out of the plurality of memory cells via a first group of bit lines out of the plurality of bit lines and a first group of bit line bars out of the plurality of bit line bars, and
      cause the recycle multiplexer to couple to a second set of memory cells out of the plurality of memory cells via a second group of bit lines out of the plurality of bit lines and a second group of bit line bars out of the plurality of bit line bars, the second set of memory cells being different from the first set of memory cell.

3. The memory device of claim 2, wherein each of the plurality of bit lines and the plurality of bit line bars is electrically coupled to a pre-charge circuit to be pre-charged to a positive power supply voltage (Vdd).

4. The memory device of claim 3, wherein when the memory controller causes the recycle multiplexer to couple to the second set of memory cells, the second group of bit lines and the second group of bit line bars are coupled to the compensation word line driver.

5. The memory device of claim 2, wherein the read/write block comprises:
   a column decoder coupled to the plurality of bit lines and the plurality of bit line bars; and
   a sense amplifier coupled to the plurality of bit lines and the plurality of bit line bars.

6. The memory device of claim 2, further comprising a feedback controller coupled to the recycle multiplexer and the compensation word line driver, the feedback controller being configured to:
  regulate an access signal from the compensation word line driver to the set of word lines.

7. The memory device of claim 6,
  wherein the feedback controller is coupled to the memory controller,
  wherein the memory controller is configured to send an enabling signal to the feedback controller to activate the feedback controller,
  wherein the feedback controller is configured to couple the recycle multiplexer to the second set of memory cells when activated.

8. A memory device, comprising:
  a first word line driver coupled to a plurality of word lines and drawing power from a first source;
  a second word line driver coupled to the plurality of word lines and drawing power from a second source different from the first source; and
  a memory cell array sandwiched between the first word line driver and the second word line driver, the memory cell array comprising a plurality rows of memory cells, each of the plurality rows of memory cells being coupled to one of the plurality of word lines,
  a plurality of bit lines and a plurality of bit line bars,
  wherein the second source comprises charges collected from at least one of the plurality of bit lines or plurality of bit line bars,
  wherein each of the plurality of word lines is coupled to and driven by both the first word line driver and the second word line driver.

9. The memory device of claim 8, further comprising:
  a plurality of bit lines and a plurality of bit line bars,
  wherein the memory cell array comprises a plurality columns of memory cells, each of the plurality columns of memory cells being coupled one of the plurality of bit lines and one of the plurality of bit line bars.

10. The memory device of claim 9, further comprising:
  a recycle multiplexer coupled to the plurality of bit lines and the plurality of bit line bars.

11. The memory device of claim 10, further comprising:
  a read/write block coupled to the plurality of bit lines and the plurality of bit line bars.

12. The memory device of claim 11, wherein the read/write block comprises:
  a column decoder coupled to the plurality of bit lines and the plurality of bit line bars; and
  a sense amplifier coupled to the plurality of bit lines and the plurality of bit line bars.

13. The memory device of claim 11, further comprising:
  a memory controller electrically coupled to the first word line driver, the recycle multiplexer, the second word line driver, and the read/write block,
  wherein the memory controller is configured to:
    cause the first word line driver to activate a row of word lines out of the plurality of word lines,
    cause the second word line driver to couple to the row of word lines,
    cause the read/write block to read or write a first set of memory cell out of the plurality rows of memory cells, and
    cause the recycle multiplexer to couple to a second set of memory cells out of the plurality rows of memory cells, the second set of memory cells being different from the first set of memory cell.

14. The memory device of claim 13, further comprising a feedback controller coupled to the recycle multiplexer and the second word line driver, the feedback controller being configured to:
  couple the recycle multiplexer and the second word line driver in response to an enabling signal from the memory controller.

15. A memory device, comprising:
  a memory cell array comprising:
    a plurality of word lines extending along a first direction from a first end of the memory cell array to a second end of the memory cell array,
    a plurality of bit lines extending along a second direction perpendicular to the first direction,
    a plurality of bit line bars extending along the second direction, and
    a plurality of memory cells, each of which is coupled to one of the plurality of word lines, one of the plurality of bit lines, and one of the plurality of bit line bars;
  a first word line driver adjacent the first end of the memory cell array, the first word line driver being coupled to the plurality of word lines;
  a second word line driver adjacent the second end of the memory cell array, the second word line driver being coupled to the plurality of word lines; and
  a charge recycle mechanism configured to collect charges from the plurality of bit lines and bit line bars and coupled to the plurality of bit lines, the plurality of bit line bars, and the second word line driver,
  wherein each of the plurality of word lines is coupled to and driven by both the first word line driver and the second word line driver.

16. The memory device of claim 15, further comprising:
  a read/write block coupled to the plurality of memory cells via the plurality of bit lines and the plurality of bit line bars; and
  a memory controller electrically coupled to the first word line driver, the second word line driver, and the read/write block,
  wherein the memory controller is configured to:
    cause the first word line driver to activate a set of word lines out of the plurality of word lines,
    cause the second word line driver to couple to the set of word lines,
    cause the read/write block to couple a first group of bit lines out of the plurality of bit lines and a first group of bit line bars out of the plurality of bit line bars, and
    cause the charge recycle mechanism to couple to a second group of bit lines out of the plurality of bit lines and a second group of bit line bars out of the plurality of bit line bars to collect charges in the second group of bit lines and the second group of bit line bars,
  wherein the first group of bit lines are different from the second group of bit lines and the first group of bit line bars are different from the second group of bit line bars.

17. The memory device of claim 16, wherein the charge recycle mechanism comprises:
  a recycle multiplexer coupled to the plurality of bit lines and the plurality of bit line bars; and
  a feedback controller coupled to the recycle multiplexer and the second word line driver and configured to control electrical coupling between the recycle multiplexer and the second word line driver.

18. The memory device of claim 17, wherein the feedback controller comprises:

a first inverter including a first input and first output;
a second inverter including a second input and a second output;
a first p-type transistor including a first gate, a first source, and a first drain; and
a second p-type transistor including a second gate, a second source, and a second drain,
wherein the first input of the first inverter is coupled to the memory controller,
wherein the first output of the first inverter is coupled to the first gate,
wherein the first source is coupled to the recycle multiplexer,
wherein the first drain is coupled to the second word line driver,
wherein the second input of the second inverter is coupled to second word line driver,
wherein the second output of the second inverter is coupled to the second gate,
wherein the second source is coupled to a positive power supply voltage (Vdd),
wherein the second drain is coupled to the first gate.

19. The memory device of claim 17, wherein the memory controller is electrically coupled to the recycle multiplexer and the feedback controller.

20. The memory device of claim 19,
wherein the memory controller is configured to send an enabling signal to the feedback controller to activate the feedback controller,
wherein the feedback controller is configured to couple the recycle multiplexer to the second group of bit lines and the second group of bit line bars when activated.

* * * * *